US010777719B2

(12) United States Patent
Kayama

(10) Patent No.: US 10,777,719 B2
(45) Date of Patent: Sep. 15, 2020

(54) BASE MEMBER, AND METHOD OF MANUFACTURING LIGHT EMITTING DEVICE USING SAME

(71) Applicant: NICHIA CORPORATION, Anan-shi, Tokushima (JP)

(72) Inventor: Kiyoshi Kayama, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/374,452

(22) Filed: Apr. 3, 2019

(65) Prior Publication Data

US 2019/0312188 A1 Oct. 10, 2019

(30) Foreign Application Priority Data

Apr. 10, 2018 (JP) .................................. 2018-075401

(51) Int. Cl.
*H01L 21/00* (2006.01)
*H01L 23/495* (2006.01)
(Continued)

(52) U.S. Cl.
CPC ........ *H01L 33/62* (2013.01); *H01L 23/49541* (2013.01); *H01L 23/49586* (2013.01); *H01L 21/561* (2013.01); *H01L 33/507* (2013.01); *H01L 33/52* (2013.01); *H01L 2933/0066* (2013.01)

(58) Field of Classification Search
CPC . H01L 21/561; H01L 21/486; H01L 21/6835; H01L 21/4846; H01L 23/49541; H01L 23/49586; H01L 23/49861; H01L 23/49562; H01L 33/0095; H01L 33/62; H01L 33/507; H01L 33/486; H01L 33/52; H01L 2933/0033; H01L 2933/0066; H01L 2933/005
See application file for complete search history.

(56) References Cited

U.S. PATENT DOCUMENTS 8,703,513 B2* 4/2014 Sakai .................... H01L 33/486
438/33
9,351,399 B2* 5/2016 Ooyabu .................. H01L 24/97
(Continued)

FOREIGN PATENT DOCUMENTS

JP 2011-003853 A 1/2011
JP 2012-227254 A 11/2012
(Continued)

*Primary Examiner* — Nikolay K Yushin
(74) *Attorney, Agent, or Firm* — Global IP Counselors, LLP

(57) ABSTRACT

A base member includes a lead frame and a resin molded body in which the lead frame is embedded. The resin molded body and the lead frame define a plurality of recesses arranged in a matrix along a first direction and a second direction orthogonally crossing the first direction in a plan view. The resin molded body has a plurality of bottom surface portions each defining a part of a bottom surface of a corresponding one of the recesses, and a wall portion surrounding each of the bottom surface portions in the plan view, with an upper surface of the wall portion defining at least one a groove portion extending in the first direction or the second direction.

20 Claims, 10 Drawing Sheets

(51) Int. Cl.
*H01L 33/62* (2010.01)
*H01L 33/52* (2010.01)
*H01L 33/50* (2010.01)
*H01L 21/56* (2006.01)

(56) References Cited

U.S. PATENT DOCUMENTS

| | | | |
|---|---|---|---|
| 9,735,198 B2* | 8/2017 | Joo | H01L 33/486 |
| 2006/0071318 A1* | 4/2006 | Yamamura | H01L 21/481 |
| | | | 257/686 |
| 2013/0256711 A1* | 10/2013 | Joo | H01L 33/486 |
| | | | 257/88 |
| 2013/0299859 A1 | 11/2013 | Onai et al. | |
| 2013/0307000 A1 | 11/2013 | Ikenaga et al. | |
| 2014/0004634 A1 | 1/2014 | Sakai et al. | |
| 2014/0203304 A1* | 7/2014 | Kim | B29C 45/14639 |
| | | | 257/88 |
| 2016/0133809 A1 | 5/2016 | Kuramoto | |

FOREIGN PATENT DOCUMENTS

| | | |
|---|---|---|
| JP | 2013-239540 A | 11/2013 |
| JP | 2014-096550 A | 5/2014 |
| JP | 2015-106620 A | 6/2015 |
| JP | 2016-092276 A | 5/2016 |
| WO | 2012102266 A1 | 8/2012 |

* cited by examiner

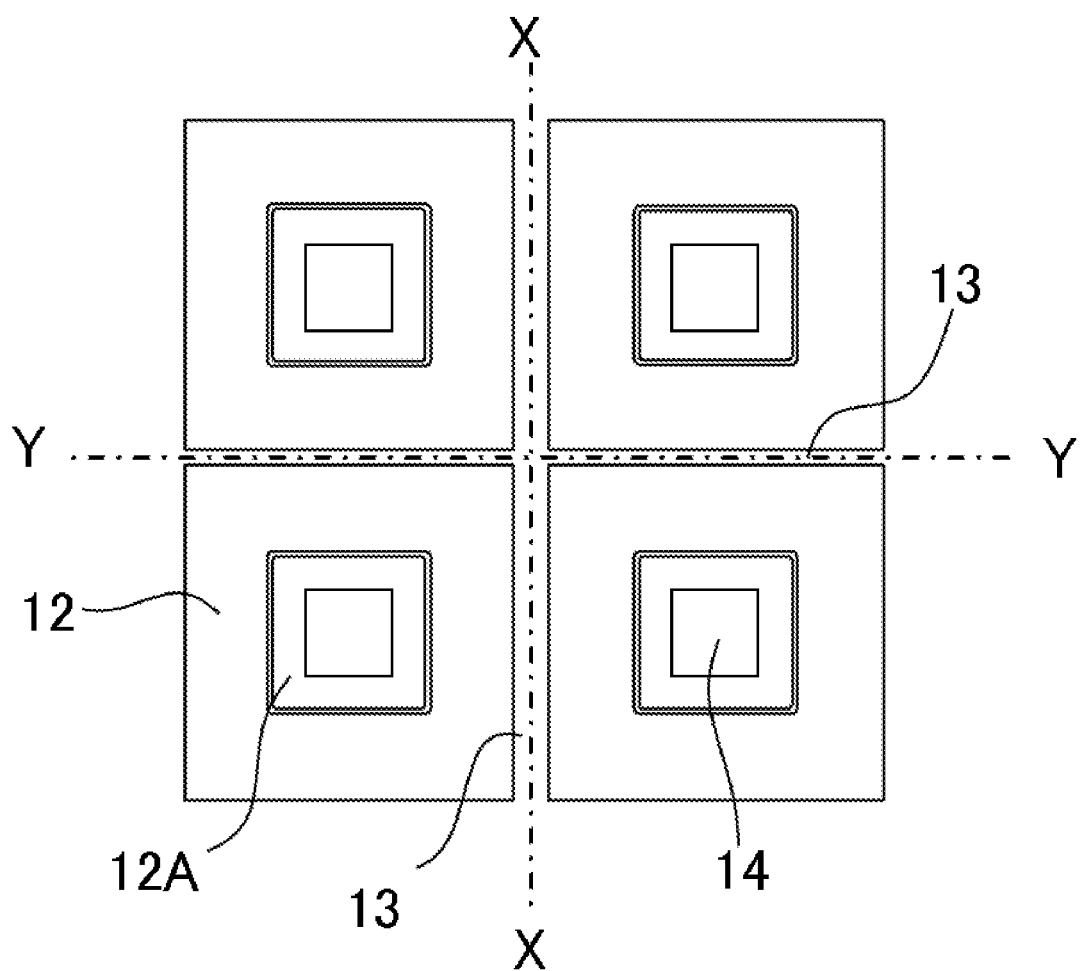

BASE MEMBER, AND METHOD OF MANUFACTURING LIGHT EMITTING DEVICE USING SAME

CROSS-REFERENCE TO RELATED APPLICATION

This application claims priority to Japanese Patent Application No. 2018-075401, filed on Apr. 10, 2018, the disclosure of which is hereby incorporated by reference in its entirety.

BACKGROUND

The present disclosure relates to a base member, and a method of manufacturing a light emitting device using the base member.

For example. Japanese Patent Publication No. 2011-3853 and Japanese Patent Publication 2014-96550 disclose a collective base member in which a resin molded body is molded integrally with a lead frame.

In the above-described base member, a difference between the thermal expansion coefficient of the lead frame and the thermal expansion coefficient of the resin molded body possibly causes warpage of the base member when a light emitting device or the like is manufactured by subjecting the base member to, for example, a step of applying heat, such as a die bonding step or a step of curing an encapsulant.

In addition, the base member may be warped not only when the base member is subjected to a step of applying heat but also when the resin molded body is expanded by absorbing moisture.

SUMMARY

Accordingly, the present disclosure is intended to provide a base member which tends not to be warped, and a method of manufacturing a light emitting device using the base member.

The present disclosure includes a base member including a lead frame and a resin molded both in which the lead frame is embedded. The resin molded body and the lead frame define a plurality of recesses arranged in a matrix along a first direction and a second direction orthogonally crossing the first direction in a plan view. The resin molded body has a plurality of bottom surface portions each defining a part of a bottom surface of a corresponding one of the recesses, and a wall portion surrounding each of the bottom surface portions in the plan view, with an upper surface of the wall portion defining at least one a groove portion extending in the first direction or the second direction.

The present disclosure further includes a method including: providing the foregoing base member; disposing a light emitting element on the bottom surface of each of the recesses; and cutting the base member at the at least one groove portion to obtain a plurality of light emitting devices.

According to the present disclosure, it is possible to provide a base member which tends not to be warped.

In addition, using a base member with less possibility of warpage can manufacture a light emitting device with less positional displacement in die bonding or the like.

BRIEF DESCRIPTION OF THE DRAWINGS

FIG. 4 is a schematic plan view for illustrating a method of manufacturing a light emitting device according to another embodiment of the present disclosure.

DETAILED DESCRIPTION

Figure 1A:
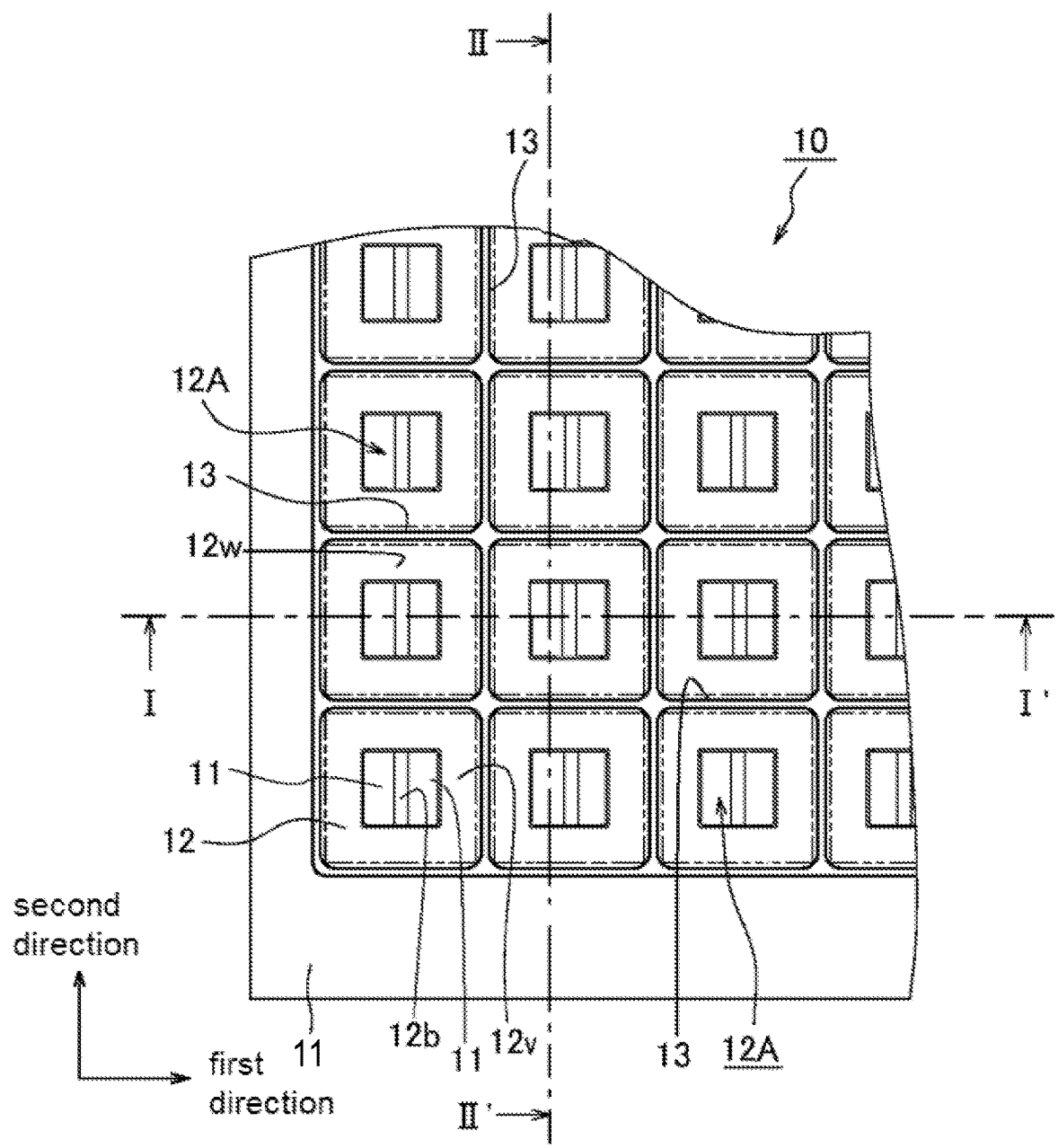
FIG. 1A is a schematic plan view of a base member according to certain embodiment of the present disclosure.
Figure 1B:
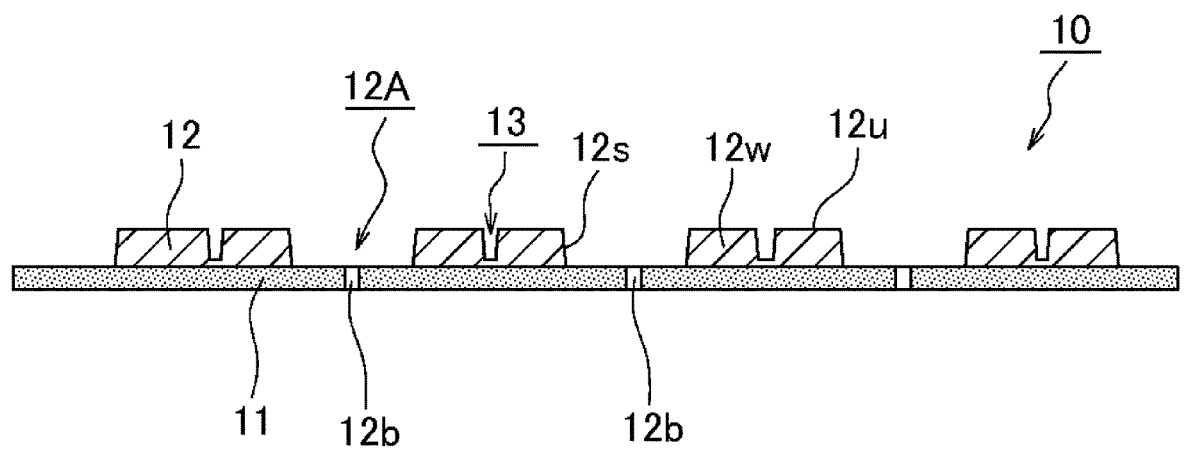
FIG. 1B is a schematic sectional view of the base member of FIG. 1A as taken along line I-I'.
Figure 1C:
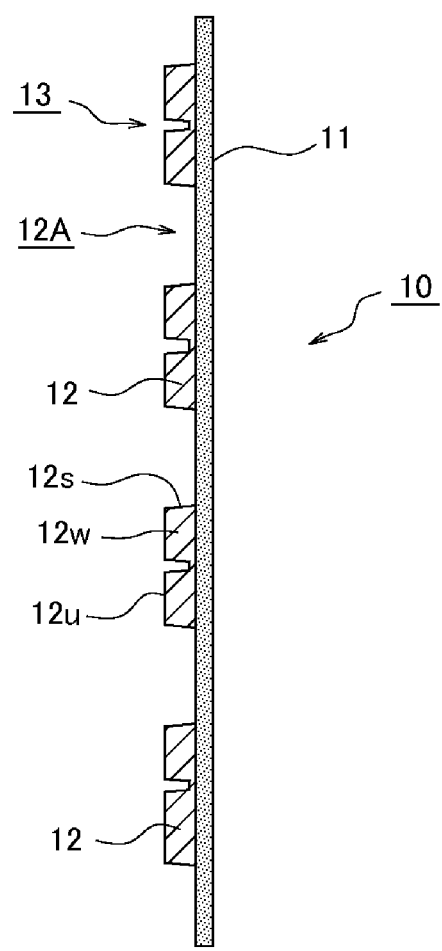
FIG. 1C is a schematic sectional view of the base member of FIG. 1A as taken along line II-II'.

Hereinafter, embodiments of the present disclosure will be described with reference to the drawings as appropriate. However, a base member and a method of manufacturing a light emitting device, which will be described below, are intended to embody the technical idea of the present disclosure, and the present disclosure is not limited to the following embodiments unless otherwise specified. In addition, the size, the positional relation and the like of the members shown in the drawings may be exaggerated for clarification of explanation.

Base Member 10

As shown in FIGS. 1A to 1D, a base member 10 according to certain embodiment of the present disclosure includes a lead frame 11, and a resin molded body 12 formed integrally with the lead frame 11. The base member 10 is provided with a plurality of recesses 12A formed in a first direction and a second direction orthogonally crossing the first direction. The resin molded body 12 has a bottom surface portion 12b disposed on the bottom surface of the recess 12A, and a wall portion 12w integrally formed with the bottom surface portion 12b. The wall portion 12w defines the recess 12A. In addition, the resin molded body 12 is provided with at least one groove portion 13 on upper surfaces between adjacent recesses 12A, in other words, a portion between upper surfaces 12u of the wall portions 12w of the recess 12A.

Thus, the groove portion 13 is partially formed on the resin molded body 12 in the base member 10 including the lead frame 11 and the resin molded body 12 having different thermal expansion coefficients. Thus, the groove portion 13 absorbs expansion or shrinkage of the lead frame 11 and the resin molded body 12, which is caused by heat or the like. As a result, warpage of the base member itself can be alleviated.

In the present application, for example, the first direction is a longitudinal direction along which the base member and the lead frame are elongated, and the second direction is a width direction orthogonally crossing the first direction. In the lead frame, a plurality of pairs of lead portions (i.e., portions which form a pair of leads after division) is continued and arranged for forming a plurality of light emitting devices, and the base member is formed by embedding some of the plurality of pairs of lead portions in the resin molded body 12. Light emitting elements and the like are disposed on the base member, and thereafter the base member is cut along the first direction and the second direction, to thereby obtaining individual light emitting devices.

Lead Frame 11

The lead frame 11 is formed by arranging the plurality of pairs of lead portions in the first direction and the second direction, and embedding some of the pairs of lead portions in the resin molded body 12. Parts of the upper surfaces of a pair of lead portions are both exposed at the bottom surface of the recess 12A.

The lead frame 11 is composed of a flat plate of copper, aluminum, gold, silver, tungsten, iron, nickel, cobalt, molybdenum or an alloy thereof, with the flat plate subjected to various kinds of processing such as pressing (including punching), etching and rolling. The lead frame 11 may be configured by a multilayer of these metals or alloys, or a single layer. In particular, copper, or a copper alloy mainly containing copper (e.g., phosphor bronze, copper-iron alloy or the like) is preferable. Accordingly, the heat dissipation property of the lead frame 11 can be improved. The lead flame may have a plated layer on a surface thereof, which is formed using silver, gold, copper, nickel, aluminum, palladium, rhodium, an alloy thereof or the like. In particular, preferably, the surface of the lead frame is provided with a plated layer of silver or a silver alloy, which has good light-reflectivity. The thickness (i.e., plate thickness) of the lead flame 11 is, for example, in a range of 0.05 mm to 1 mm, preferably 0.1 mm to 0.4 mm, more preferably 0.1 mm to 0.3 mm.

The pairs of lead portions may have various shapes. In particular, preferably one lead portion and the other lead portion in the each pair of lead portions are exposed at the bottom surfaces of recesses 12A with substantially the same surface area. Accordingly, at the time when stress such as warpage is applied to the base member 10, the stress is likely to be uniformly applied to the lead portions. This can reduce the possibility of concentrating stress on only some regions in the base member 10.

Figure 1D:
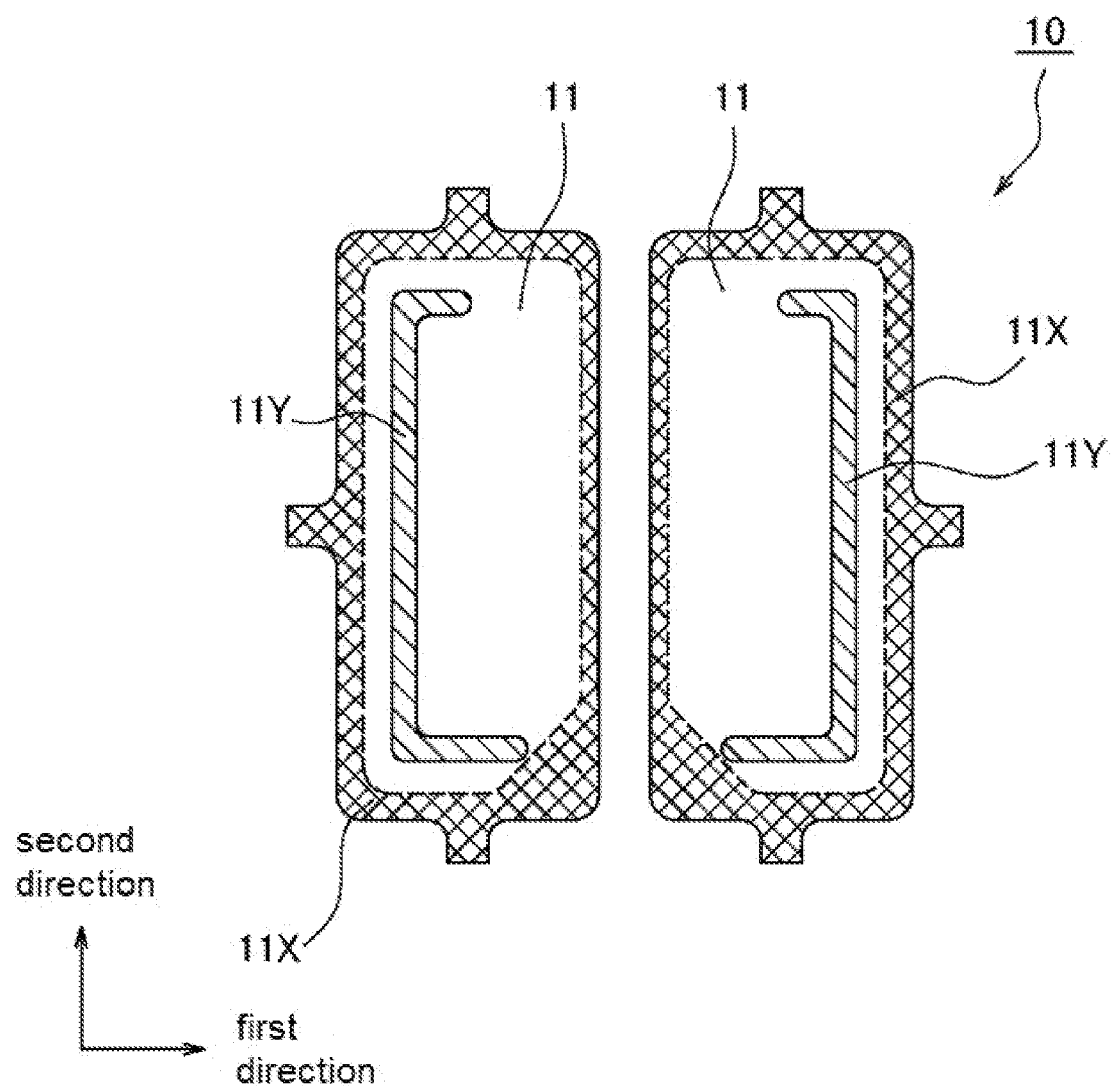
FIG. 1D is a schematic plan view showing a pair of lead portions.

Preferably, a partially thin portion 11X is formed along the outer periphery on the lower surface of the lead portion as shown with a cross hatching in FIG. 1D. Accordingly, adhesion with the resin molded body 12 can be improved. In FIG. 1D, a level difference on the lower surface of the lead frame 11, which defines a boundary between the partially thin portion 11X and other portion of the lead frame, is represented by a broken line. In addition, a groove 11Y may be formed on the upper surface of the lead portion positioned as shown with a diagonal hatching in FIG. 1D. The groove 11Y may be positioned below the wall portion of the resin molded body. Accordingly, adhesion between the resin molded body and the lead frame can be further improved. For example, the groove 11Y may have a structure in which the groove 11Y has an unpierced bottom, or a structure in which the groove 11Y pierces the lead frame from the upper surface to the lower surface.

Resin Molded Body 12

The resin molded body 12 is formed integrally with the lead frame with the lead frame at least partially embedded in the resin molded body 12. Preferably, the lower surface of the lead frame is exposed from the resin molded body 12. This can dissipate heat from the lower surface of the lead frame when heat is applied to the base member. The resin molded body 12 is formed with a plurality of recesses 12A which is defined by the resin molded body 12 and the lead frame 11 in the first direction and the second direction for accommodating light emitting elements. Preferably, the recesses 12A are arranged at substantially equal intervals in the first direction or the second direction.

The recess 12A is defined by a pair of lead portions and the resin molded body 12. The upper surfaces of a pair of lead portions are exposed at the bottom surface of the recess 12A. The bottom surface portion 12b forming a part of the resin molded body 12 configures as a part of the recess 12A. The resin molded body is integral with the bottom surface portion 12b, and has the wall portion 12w continuing from the bottom surface portion 12b. The wall portion 12w forms lateral surfaces 12s inside the recess 12A. The height of the wall portion 12w or the lateral surfaces 12s is, for example, in a range of 0.2 mm to 1 mm, preferably 0.2 mm to 0.8 mm, more preferably 0.2 mm to 0.5 mm. The lateral surfaces 12s of the all portion 12w may be perpendicular or inclined to the upper surface of the lead frame. The degree of inclination can be appropriately determined.

The resin molded body 12 has the upper surface 12u positioned between adjacent recesses. The upper surfaces 12u each extend with a predetermined width in both the first direction and the second direction. In the present embodiment, the upper surfaces preferably have a constant width, but may partially have different widths. In addition, the width in the first direction and the width in the second direction are not necessarily required to be the same, and may be different. For example, the width of the upper surface 12u is 0.1 µm to 1 µm, preferably 0.3 µm to 0.7 µm.

The resin molded body 12 is provided with the groove portion 13 formed in the upper surface 12u between adjacent recesses 12A in top view. The groove portion 13 preferably extends in at least one of the first direction and the second direction. More preferably, the groove portion 13 extends in both the first direction and the second direction.

Preferably, the groove portion 13 is formed continuously from one end to the other end of the resin molded body in the first direction and the second direction in top view. Accordingly, warpage of the base member 10 can be effectively alleviated. The groove portion 13 may be formed only partially between one end and the other end at the resin molded body in the first direction or the second direction in top view. In each of the first direction and/or the second direction, the groove portion 13 may be formed in one row, or in two or more rows.

The groove portion 13 in the first direction and the groove portion 13 in the second direction may have the same width, but preferably have different width. For example, as shown in FIG. 4, it is preferable that the width of the groove portion extending in the first direction (see line Y) is smaller than the width of the groove portion extending in the second direction (see line X). The width of the groove portion 13 is, for example, in a range of 0.1 mm to 1 mm, preferably 0.1 mm to 0.8 mm, more preferably 0.15 mm to 0.6 mm.

For example, the depth of the groove portion 13 with respect to the maximum thickness of the resin molded both is preferably 30% to 80%, more preferably 30% to 60%. Specifically, the depth of the groove portion 13 is, for example, in a range of 0.1 mm to 0.5 mm, preferably 0.1 mm to 0.4 mm, more preferably 0.15 mm to 0.35 mm.

In the light emitting device provided with the groove portion, the groove portion absorbs stress caused by thermal expansion or shrinkage between the lead frame and the resin molded body having different thermal expansion coefficients. As a result, warpage of the base member, which is caused by stress resulting from thermal expansion or shrinkage, can be effectively suppressed. In particular, in a die-bonding step of a light emitting element or an encapsulant disposing step in which heat is applied to the base member, a difference in thermal expansion or shrinkage between the lead frame and the resin molded body is noticeable. In such a step, warpage of the base member can be further effectively alleviated when the base member is provided with the groove portion.

The resin molded body is preferably a member having high light-reflectiveness. The high light-reflectiveness means that a light emitting element mounted on the base member has a light-reflectivity of 50% or more at a peak emission wavelength. The light-reflectiveness of the resin molded body is preferably at least 75%, more preferably at least 90%. In addition, the resin molded body is preferably white. The resin molded body preferably has a flowability, i.e., a liquid state, a sol state, a slurry state or the like, before the resin molded body is solidified. The resin molded body can be molded by an injection molding method, a transfer molding method or the like.

For the resin molded body, a thermosetting resin or a thermoplastic resin can be used as a resin material that is a base material. Specifically preferable example of a resin material for the resin molded body include a thermosetting resin such as an epoxy resin or a silicone resin, which is good in heat resistance and light resistance.

Examples of the thermosetting resin include epoxy resins, silicone resins, polyimide resins, polyurethane resins, polybismaleimide-triazine resins, unsaturated polyester, and modified resins or hybrid resins thereof. Among them, epoxy resins, silicone resins, unsaturated polyester, and modified resins or hybrid resins thereof are preferable. In particular, it is preferable that a thermosetting resin such as an epoxy resin or a silicone resin, which is good in heat resistance and light resistance, is used as a resin material for the resin molded body.

Examples of the thermoplastic resin include cycloaliphatic polyamide resins, semi-aromatic polyamide resins, polyethylene terephthalate, polycyclohexane terephthalate, liquid crystal polymers, polycarbonate resins, syndiotactic polystyrene, polyphenylene ether, polyphenylene sulfide, polyether sulfone resins, polyether ketone resins, polyarylate resins, and modified resins or hybrid resins thereof. Among them, cycloaliphatic polyamide resins, polycyclohexane terephthalate, and modified resins or hybrid resins thereof are preferable.

Preferably, the resin molded body contains a white pigment and/or a filling agent and the like in the above-described resin from the viewpoint of light-reflectiveness, mechanical strength, thermal expansion property and so on.

Examples of the white pigment include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide and zirconium oxide. These white pigments can be used singly, or in combination of two or more thereof. Among them, titanium oxide is preferable because it has a relatively high refractive index, and is good in light shielding property. The shape of the white pigment may be irregular form such as crushed shape, but is preferably spherical from the viewpoint of flowability.

Examples of the filling agent include silica, aluminum oxide, glass, potassium titanate, wollastonite (e.g., calcium silicate), mica and talc. These filling agents can be used singly, or in combination of two or more thereof. The shape of the filling agent may be irregular form such as crushed shape, but is preferably fibrous or tabular (e.g., scaly) from the viewpoint of a function as a reinforcing agent, or preferably spherical from the viewpoint of flowability.

The base member 10 is formed by a method known in the art, for example, a method in which a lead frame processed into a predetermined shape is sandwiched between upper and lower molds, a resin to be formed into a resin molded body is poured into the upper and lower molds, and the resin is solidified.

The groove portion is formed by, for example, removing only a part of the resin molded body along the first direction and/or the second direction using a blade having a predetermined thickness. In addition, in a mold for forming a resin molded body on a lead frame, an upper mold having a projection at a predetermined part corresponding to a groove portion may be prepared, followed by forming the groove portion concurrently with forming a base member.

Method of Manufacturing Light Emitting Device

Figure 2A:
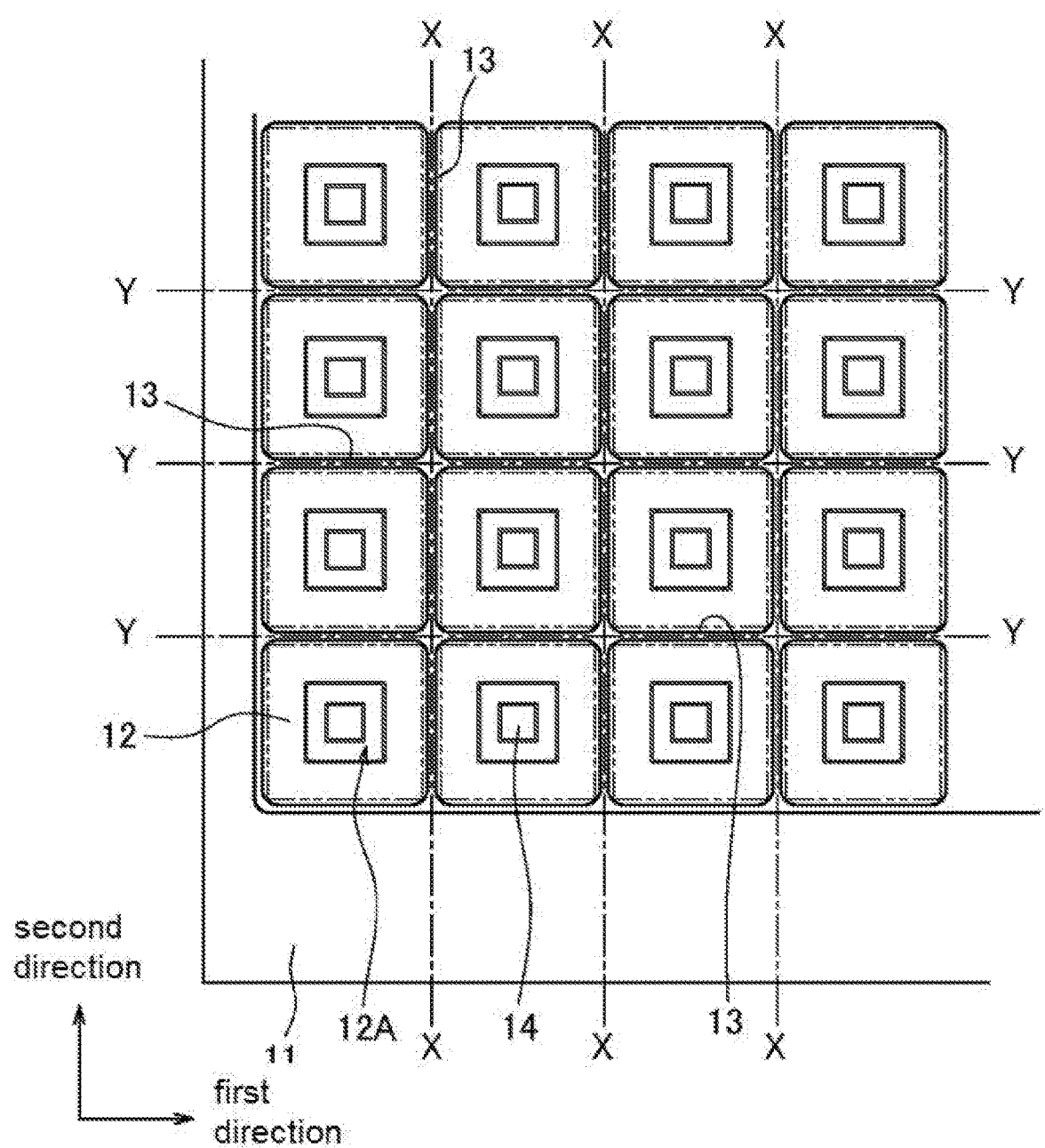
FIG. 2A is a schematic plan view for illustrating a method of manufacturing a light emitting device according to certain embodiment of the present disclosure.
Figure 2B:
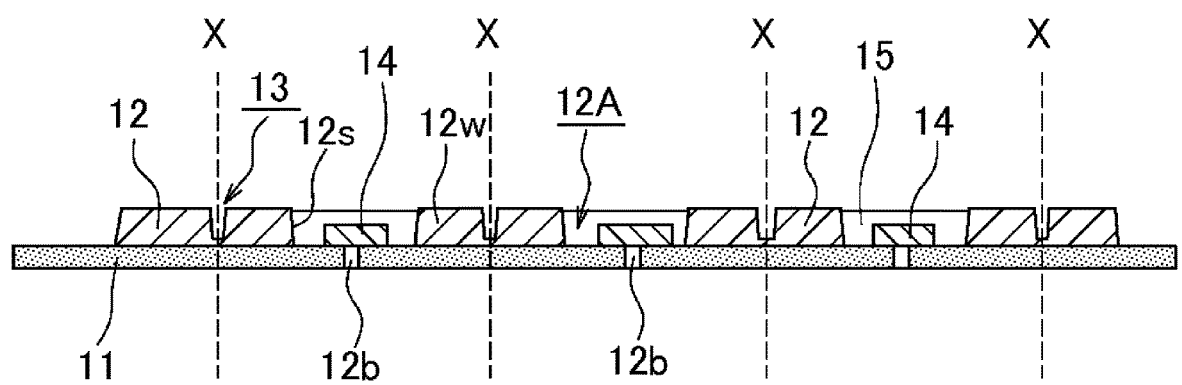
FIG. 2B is a schematic plan view for illustrating the method of manufacturing the light emitting device according to the embodiment of the present disclosure.

Certain embodiment of the method of manufacturing a light emitting device includes: providing the base member 10 shown in FIGS. 1A to 1D; disposing a light emitting element 14 on the bottom surface of the recess 12A of the base member 10 as shown in FIGS. 2A and 2B; and cutting the base member 10 at at least one groove portion as shown in FIG. 2B.

Figure 2C:
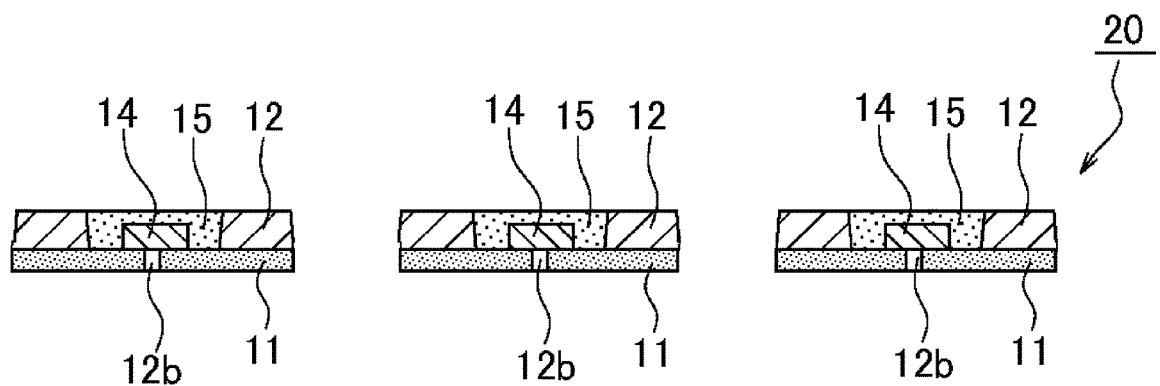
FIG. 2C is a schematic plan view for illustrating the method of manufacturing the light emitting device according to the embodiment of the present disclosure.

As shown in FIG. 2C, a plurality of light emitting devices 20 can be obtained through these steps.

The base member described in the present embodiment is the same as or similar to the base member 10 described above. In the cutting step, the width of a cutting tool and the width of the groove portion 13 may be the sane, or different. Preferably, the width of the cutting tool is larger than the width of the groove portion 13. In the light emitting device 20 obtained by dividing the base member using such a cutting tool, a trace of the groove portion 13 does not remain on the outside surface of the light emitting device 20. Accordingly, a light emitting device having a smooth or flush outside surface can be obtained. In addition, cutting the base member 10 along the groove portion 13 can reduce stress of cutting the base member 10. This can alleviate deformation and warpage of the base member 10.

Preferably, the method of manufacturing a light emitting device includes a heating step of heating the base member after providing the base member 10 and before cutting the base member 10. Examples of the heating step include a die bonding step in which a light emitting element is mounted on a lead frame, and a resin curing step in an encapsulant disposing step as described later. In particular, the groove portion 13 in the base member 10 can effectively alleviate warpage of the base member 10 by acting to release stress caused by thermal expansion or shrinkage between the lead frame 11 and the resin molded body 12 before and after the heating step.

Mounting of Light Emitting Element 14 in Recess 12A

A plurality of light emitting elements 14 is provided, and the light emitting elements 14 are mounted on the bottom surface of the recess 12A as shown in FIGS. 2A and 2B.

For the light emitting element 14, a semiconductor light emitting element such as an LED element can be used. The light emitting element may have an element structure composed of various semiconductors, and a pair of positive and negative electrodes. In particular, a light emitting element of nitride semiconductor ($In_xAl_yGa_{1-x-y}N$, $0 \leq x$, $0 \leq y$, $x+y \leq 1$) capable of emitting light in an ultraviolet-to-visible region is preferable. In addition, the light emitting element may be a light emitting element of gallium arsenide-based semiconductor or gallium phosphide-based semiconductor, which emits green-to-red light.

A pair of positive and negative electrodes may be disposed on the same surface side of the element structure, or on different surface sides, respectively, on the element structure. The light emitting element with the electrodes provided on the same surface side may be mounted either by face-up mounting or by flip-chip-mounting. In the light emitting element with the electrodes respectively provided on different surface sides, the lower surface electrode is connected to one lead with an electrically conductive adhesive, and the upper surface electrode is connected to the other lead with a wire.

One or more light emitting elements may be mounted in one recess. For example, three light emitting elements which respectively emit blue light, green light and red light may be mounted in one recess, or two light emitting elements which respectively emit blue light and green light, may be mounted in one recess. A plurality of light emitting elements can be connected in series or in parallel with a wire.

Figure 2D:
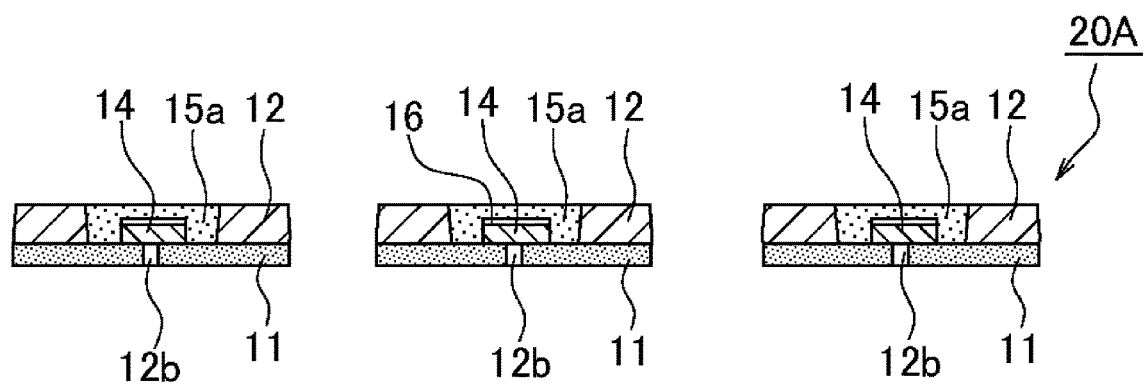
FIG. 2D is a schematic plan view for illustrating the method of manufacturing a light emitting device according to another embodiment of the present disclosure.

For example, a wavelength conversion member 16 may be disposed on the upper surface of the light emitting element 14. Accordingly, it is possible to obtain a light emitting device 20A capable of emitting light with various wavelengths as shown in FIG. 2D. Preferably, the wavelength conversion member 16 contains, for example, the above-described light-transmissive resin and a fluorescent material. In this case, an encapsulant 15a is not required to contain a fluorescent material.

As described above, a pair of lead portions is both partially exposed at the bottom surface of the recess of the base member. Thus, it is preferable that the light emitting element is mounted on one or both of the lead portions, and bonded. For example, the light emitting element is preferably flip-chip-mounted on the upper surfaces of both the lead portions. Bonding can be performed using, for example, a bonding member such as: a bump of gold, silver, copper or the like; a metal paste containing metal powder of silver, gold, copper, platinum, aluminum, palladium or the like and a resin binder; solder such as tin-bismuth-based solder, tin-copper-based solder, tin-silver-based solder, gold-tin-based solder or the like, or a brazing material such as a low-melting-point metal.

In addition, it is preferable that after the light emitting element 14 is mounted on the bottom surface of the recess 12A, an encapsulant 15 is formed in the recess 12A as shown in FIG. 2B. The encapsulant 15 protects the light emitting element 14 from dust, moisture, an external force and the like by encapsulating the light emitting element 14. The encapsulant 15 may be electrical insulation, and is transmissive to light emitted from the light emitting element, with a light transmittance of preferably at least 70%, more preferably at least 85% at a light emission peak wavelength of the light emitting element. Examples materials of the encapsulant include silicone resins, epoxy resins, phenol resins, polycarbonate resins, acrylic resins, TPX resins, polynorbornene resins and modified resins or hybrid resins thereof. Among them, silicone resins and modified resins or hybrid resins thereof are preferable because they are good in heat resistance and light resistance, and have small volumetric shrinkage after being cured. The encapsulant 15 may contain a fluorescent material.

The fluorescent material absorbs at least a part of primary light emitted from the light emitting element, and emits secondary light having a wavelength different from that of primary light. Examples of yttrium aluminum garnet activated by cerium, nitrogen-containing calcium aluminosilicate activated by europium and/or chromium, SiAlON activated by europium, silicate activated by europium, potassium fluorosilicate activated by manganese, quantum dots, or the like. The quantum dots are particles having a particle size of in a range of about 1 nm to 100 nm, and are capable of changing a light emission wavelength according to a particle size. Examples of the quantum dots include those of cadmium selenide, cadmium telluride, zinc sulfide, cadmium sulfide, lead sulfide, lead selenide and cadmium mercury telluride. These fluorescent materials can be used singly, or in combination of two or more thereof. This can provide a light emitting device which emits mixed-color light (e.g. white light) of primary light and secondary light with a visible wavelength.

Cutting of Base Member 10

A plurality of light emitting devices can be obtained by cutting the base member 10 as shown in FIGS. 2A and 2B. In cutting of the base member 10, it is preferable to cut the resin molded body 12 and the lead frame 11 simultaneously.

Cutting the base member can be performed, for example, by cutting the base member so as to pass through the center of the groove portion using a blade having a predetermined width. In this step, it is preferable to use a blade having a width larger than that of the blade used for forming the groove portion. For example, the width of the blade is in a range of 0.1 mm to 0.5 mm, preferably 0.2 mm to 0.4 mm. The cutting can be performed by using laser light or the like instead of using the blade.

Cutting the base member along the groove portion 13 (see lines X and Y in FIGS. 2A and 2B) can reduce the ratio at which the trace of the groove portion 13 remains in the light emitting device after division, or the trace of the groove portion 13 does not remain in the light emitting device after division. This can provide a light emitting device having a cut surface having a small step difference, or a light emitting device having a flat cat surface.

First Embodiment

Base Member

A base member 10 of this embodiment includes a lead frame 11 and a resin molded body 12 as shown in FIGS. 1A to 1D.

The lead frame 11 is a metal plate having a copper base material subjected to punching processing, and a silver plating applied to a surface of the base material. The lead frame 11 has a substantially rectangular, shape having a length in a range of 75 mm and 61 mm in a first direction (i.e., longitudinal direction) and a second direction (i.e., width direction) respectively, and has a thickness of 0.2 mm.

The resin molded body 12 is configured, for example, with an epoxy-based resin containing 10% by weight to 20% by weight of titanium oxide as a white pigment and 60% by weight to 70% by weight of spherical silica as a filling agent.

In the resin molded body 12, a Zener diode is disposed as a protective element.

At least one groove portion 13 extends along the first direction and the second direction on an upper surface 12u between recesses 12A. The groove portion 13 has a width of 0.15 mm and a depth of 0.3 mm in the first direction. The groove portion 13 has a width of 0.15 mm and a depth of 0.3 mm in the second direction.

As a comparison with the present disclosure, a base member was prepared with the same structure as the base member described above except for that no groove portion was formed.

The above-described base member and the comparative base member were subjected to the die-bonding step of a light emitting element and the encapsulant disposing step, which involved a heating step.

Figure 3A:
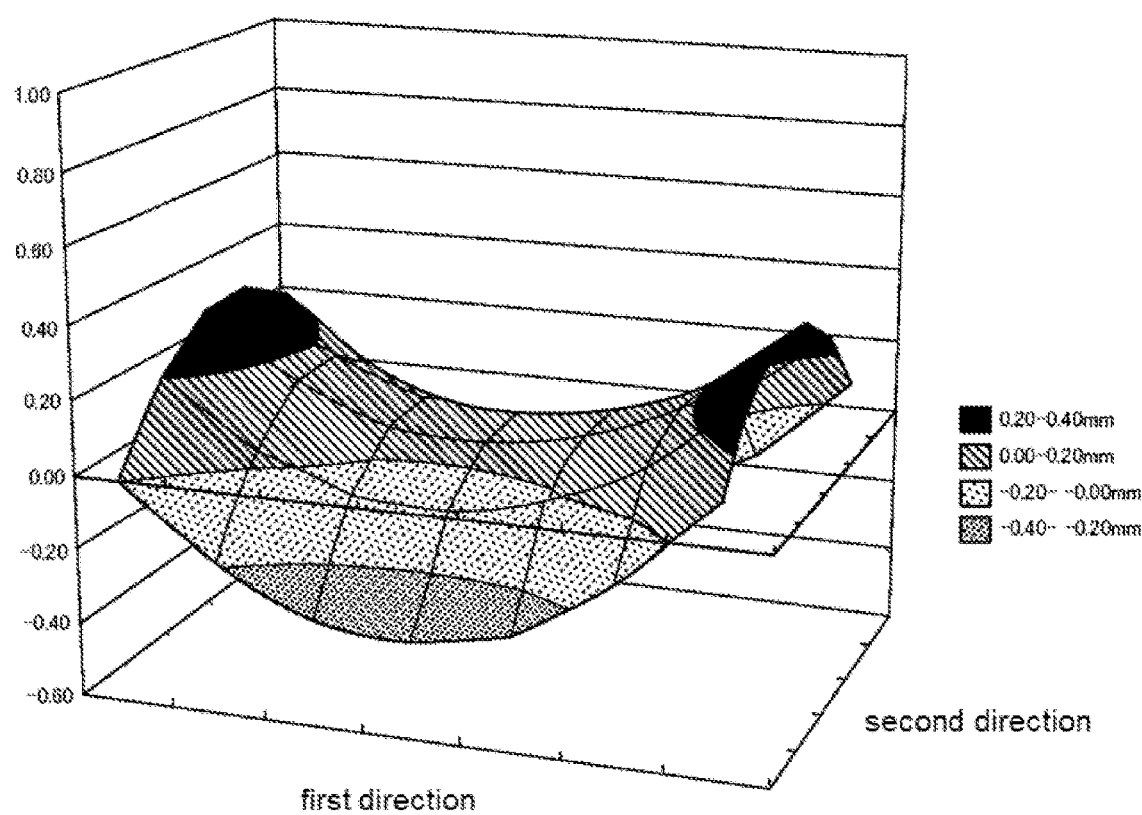
FIG. 3A is a graph showing warpage of a base member according to certain embodiment of the present disclosure.
Figure 3B:
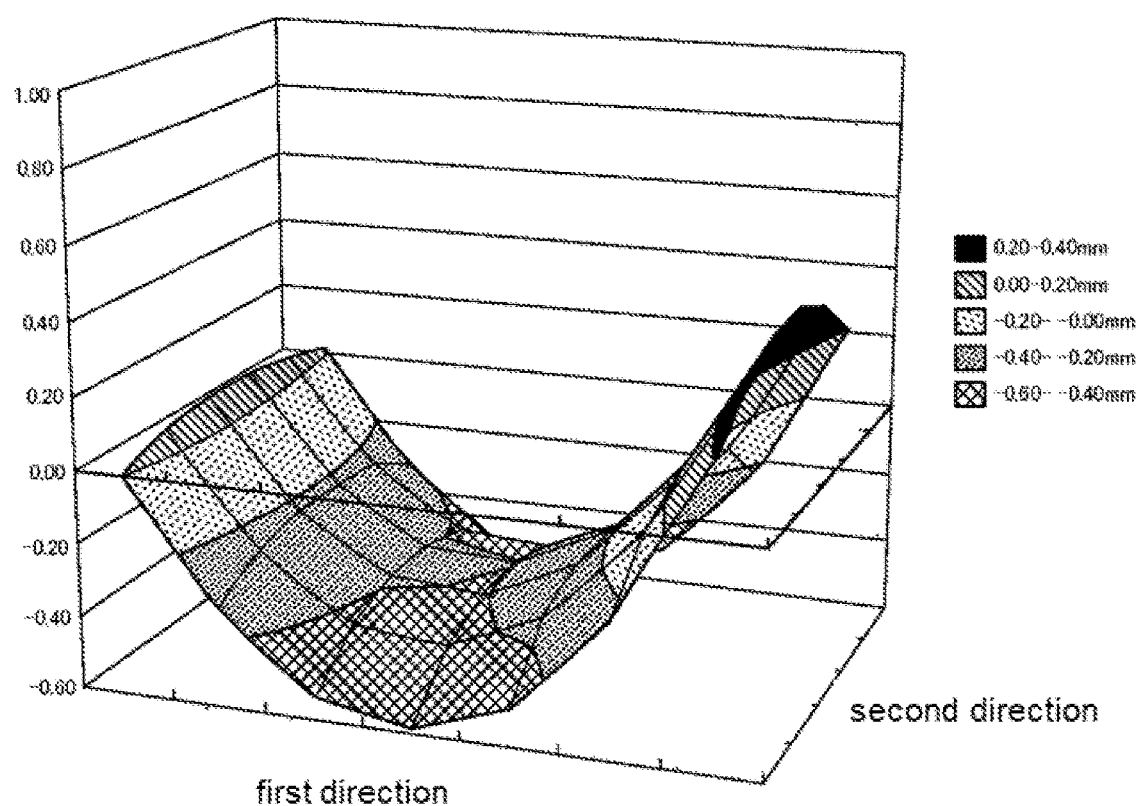
FIG. 3B is a graph showing warpage of a comparison base member with no groove portion formed.

As a result, as shown in FIG. 3B, considerable warpage was observed in the base member with no groove portion such that the base member was warped by about −0.6 mm particularly in the longitudinal direction.

On the other hand, as compared to the warpage shown in FIG. 3B, warpage of the base member 10 provided with groove portions was considerably reduced as shown in FIG. 3A.

Thus, in the base member 10 provided with a groove portion on the upper surface of the resin molded body, stress resulting from a difference in thermal expansion coefficient between the lead frame 11 and the resin molded body 12 can be effectively absorbed by the groove portion 13 of the resin molded body 12 even when the base member 10 is subjected to the die bonding step of a light emitting element and the encapsulant disposing step or the like, which involve a heating step. As a result, it has been confirmed that warpage of the base member can be effectively alleviated.

Second Embodiment

Method of Manufacturing Light Emitting Device

In a method of manufacturing a light emitting device according to a second embodiment, the base member 10 is provided as shown in FIGS. 1A to 1D. On a pair of leads exposed in a recess 12A of the base member 10, a light emitting element 14 is flip-chip-mounted with an Au/Sn paste as shown in FIGS. 2A and 2B, in this die bonding step, the base member 10 is heated at, for example, 320° C.

Subsequently, for example, a resin material in which 80% by weight of a KSF fluorescent material is contained in a phenyl silicone resin is supplied in the recess 12A of the base member 10 so as to fully cover the light emitting element 14, and heated at 150° C. for 3 hours to form an encapsulant 15.

Thereafter, the base member 10 is cut along a groove portion 13.

Through these steps, as shown in FIG. 2C, it is possible to obtain a light emitting device 20 with smooth lateral surfaces configured with a resin molded body 12 and the lead flush with each other.

In addition, even when heating treatments in these steps are performed, the base member 10 is less likely to warped, to thereby achieve a light emitting device with high positional accuracy and high desirable quality.

As a modification of the light emitting device, a light emitting device 20A can be provided. The light emitting device 20A includes the encapsulant 15a containing substantially no fluorescent material, and a light emitting element 14 on which a wavelength conversion member 16 is disposed, as shown in FIG. 2D. The light emitting device 20A can achieve the same effect as described above.

The base member and the method of manufacturing a light emitting device according to the present disclosure can be used for manufacturing light emitting devices to be used for backlight devices of liquid crystal displays, various lighting fixtures, large displays, various display devices for advertisement, destination guide and the like, projector devices, image reading devices in, for example, digital video cameras, facsimile machines, copy machines and scanners, and the like.

What is claimed is:

1. A base member comprising:
    a lead frame; and
    a resin molded body in which the lead frame is embedded, the resin molded body extending in a first direction, which is a longitudinal direction, and a second direction, which is a width direction, orthogonally crossing the first direction in a plan view;
    the resin molded body and the lead frame defining a plurality of recesses arranged in a matrix along the first direction and the second direction in the plan view, and
    the resin molded body having
        a plurality of bottom surface portions each defining a part of a bottom surface of a corresponding one of the recesses, and
        a wall portion surrounding each of the bottom surface portions in the plan view, with an upper surface of the wall portion defining at least one groove portion extending in the first direction and at least one groove portion extending in the second direction, a width of the at least one groove portion extending in the first direction being smaller than a width of the at least one groove portion extending in the second direction.

2. The base member according to claim 1, wherein the resin molded body is formed of a modified silicone-based resin.

3. The base member according to claim 1, wherein a lower surface of the lead frame is exposed from the resin molded body.

4. A method of manufacturing a light emitting device comprising:
    providing the base member according to claim 1;
    disposing a light emitting element on the bottom surface of each of the recesses; and
    cutting the base member at the at least one groove portion to obtain a plurality of light emitting devices.

5. The method of manufacturing a light emitting device according to claim 4, wherein
    the cutting of the base member includes cutting the resin molded body and the lead frame simultaneously.

6. The method of manufacturing a light emitting device according to claim 4, wherein
    the cutting of the base member includes cutting the base member using a cutting tool having a thickness larger than a width of the at least one groove portion.

7. The method of manufacturing a light emitting device according to claim 4, further comprising
    heating the base member after the providing of the base member and before the cutting of the base member.

8. The base member according to claim 1, wherein the at least one groove portion has a depth of 30% to 80% of a maximum thickness of the resin molded body.

9. The base member according to claim 5, wherein the resin molded body is formed of a modified silicone-based resin.

10. The base member according to claim 9, wherein
a lower surface of the lead frame is exposed from the resin molded body.

11. The base member according to claim 5, wherein
a lower surface of the lead frame is exposed from the resin molded body.

12. A method of manufacturing a light emitting device comprising:
provinding the base member according to claim 11;
disposing a light emitting element on the bottom surface of each of the recesses; and
cutting the base member at the at least one groove portion to obtain a plurality of light emitting devices.

13. The method of manufacturing a light emitting device according to claim 12, wherein
the cutting of the base member includes cutting the resin molded body and the lead frame simultaneously.

14. The method of manufacturing a light emitting device according to claim 13, wherein
the cutting of the base member includes cutting the base member using a cutting tool having a thickness larger than a width of the at least one groove portion.

15. The method of manufacturing a light emitting device according to claim 14, further comprising
heating the base member after the providing of the base member and before the cutting of the base member.

16. A method of manufacturing a light emitting device comprising:
providing the base member according to claim 5;
disposing a light emitting element on the bottom surface of each of the recesses; and
cutting the base member at the at least one groove portion to obtain a plurality of light emitting devices.

17. The method of manufacturing a light emitting device according to claim 16, wherein
the cutting of the base member includes cutting the resin molded body and the lead frame simultaneously.

18. The method of manufacturing a light emitting device according to claim 16, wherein
the cutting of the base member includes cutting the base member using a cutting tool having a thickness larger than a width of the at least one groove portion.

19. The method of manufacturing a light emitting device according to claim 16, further comprising
heating the base member after the providing of the base member and before the cutting of the base member.

20. The method of manufacturing a light emitting device according to claim 16, wherein
the resin molded body is formed of a modified silicone-based resin.

* * * * *